United States Patent [19]

Moskowitz et al.

[11] Patent Number: 5,122,442
[45] Date of Patent: Jun. 16, 1992

[54] METHOD FOR FORMING AN IMAGE FROM A HIGH SPEED SCREEN PRINTING COMPOSITION ON A SCREEN MESH

[75] Inventors: Gerald Moskowitz, Livingston, N.J.; David M. Brown, Warwick, R.I.

[73] Assignee: Hoechst Celanese Corporation, Somerville, N.J.

[21] Appl. No.: 386,935

[22] Filed: Jul. 28, 1989

[51] Int. Cl.⁵ ............................ G03F 7/32; G03F 7/021
[52] U.S. Cl. ............................ 430/325; 430/157; 430/175; 430/176; 430/308; 430/168; 430/169
[58] Field of Search ............ 430/325, 308, 175, 157, 430/176

[56] References Cited

U.S. PATENT DOCUMENTS

| | | | |
|---|---|---|---|
| 3,235,382 | 2/1966 | Neugebauer | 96/33 |
| 3,235,383 | 2/1966 | Steppan | 96/33 |
| 3,236,646 | 2/1966 | Steppan | 96/33 |
| 3,246,986 | 4/1966 | Borchers | 96/35 |
| 3,300,309 | 1/1967 | Chu | 96/75 |
| 3,503,330 | 3/1970 | Chu | 101/455 |
| 3,510,307 | 5/1970 | Borchers | 96/75 |
| 3,849,392 | 11/1974 | Steppan | 260/141 |
| 3,867,147 | 2/1975 | Teuscher | 96/33 |
| 4,021,243 | 5/1977 | Steppan | 430/308 |
| 4,435,496 | 3/1984 | Walls et al. | 430/285 |
| 4,436,804 | 3/1984 | Walls | 430/157 |

*Primary Examiner*—Charles L. Bowers, Jr.
*Assistant Examiner*—John S. Chu
*Attorney, Agent, or Firm*—Andrew F. Sayko, Jr.

[57] ABSTRACT

The method for forming an image which comprises
I). providing a mesh fabric substrate, and
II). coating said substrate with a light sensitive screen printing composition which comprises in admixture
   A). at least one substantially water soluble binder resin component comprising an admixture of polyvinyl alcohol and polyvinyl acetate in an amount of from about 33% to about 90% polyvinyl alcohol and from about 10% to about 67% polyvinyl acetate based on the weight of the resin component, in sufficient amount to bind the composition components in a substantially uniform film when the composition is coated on a substrate and dried; and
   B). a photosensitive component in sufficient amount to substantially, uniformly photosensitize the composition,
   C). sufficient water to form a substantially homogeneous admixture; and
III) drying the composition; and
IV) imagewise exposing the composition to sufficient actinic radiation to provide a latent image on the coated substrate; and
V) removing the nonimage areas of the compositions by developing with water alone.

9 Claims, No Drawings

METHOD FOR FORMING AN IMAGE FROM A HIGH SPEED SCREEN PRINTING COMPOSITION ON A SCREEN MESH

BACKGROUND OF THE INVENTION

The present invention relates to water soluble photosensitive compositions useful for screen printing emulsions.

The art of screen printing is well known in the printing trade. According to this method of printing, a fine-mesh fabric, is stretched across a frame and an image is formed on the fabric. The screen printing stencil to which the image is attached is then placed against the surface to be imprinted, and ink is forced through the screen onto the surface to print on those areas of the surface not covered by the image.

In screen printing, two main photosensitive stencil systems are used. In the indirect method, a photosensitive composition is coated onto a transparent support, usually a polyester material. The coated support is irradiated with actinic light through transparency after which the image obtained is developed. The wet image on its polymeric backing support sheet is then adhered to a screen and, after drying, the polymeric support is removed, leaving the image on the screen mesh ready for printing.

In the direct method, an image is produced on a screen mesh by photosensitizing a water-soluble colloid with a photosensitizer which can be a polymeric diazonium salt, and then coating the composition onto the screen. The coated layer on the screen, after drying, is exposed to actinic light through a suitable transparency to produce a latent image. On development of the image, the areas irradiated by the actinic light remain as they have become insoluble in the developer, while the areas protected from the actinic light retain the original water-solubility of the water-soluble colloid, are washed away to leave an image which, after drying, is ready for printing.

One such method is disclosed in U.S. Pat. No. 3,246,986. In accordance with this method, a screen is coated with a polymeric emulsion containing a light sensitizer. The coated screen is allowed to dry and then exposed to light through a master such as a photographic negative. The light which passes through the master onto the coated screen causes the polymer to be hardened into a water-insoluble pattern corresponding to that of the master, while those areas of the coated screen protected from the light are unaffected and remain unhardened and water soluble. Thus, in effect, there is created a "latent image" which can be "developed" on the screen by washing it with water to leave the image-defining hardened material on the screen and to form a screen printing stencil. Various polymers and light sensitizers have been used in this method. Typical polymers or colloids disclosed for this purpose are polyvinyl alcohol, partially acrylated polyvinyl alcohol, partially hydrolyzed polyvinyl acetate, partially acetylated polyvinyl alcohol, polyacrylic acid, methyl cellulose and gelatin. Typical light sensitizing compounds have included dichromates and condensation products of diazo diphenylamines with aldehydes. It is known in the art to produce compositions for use in screen printing screens which are diazonium compound-sensitized polyvinyl alcohol/polyvinyl acetate emulsions. Such emulsions have several drawbacks since the photosensitivity is relatively low and contains residual formaldehyde.

Several prior art screen emulsions are known from U.S. Pat. No. 4,118,223; U.S. Pat. No. 3,246,986; U.S. Pat. No. 4,418,138; U.S. Pat. No. 4,362,808; U.S. Pat. No. 3,849,392; and U.S. Pat. No. 4,286,048; as well as U.K. Patent No. 1,312,926 and U.K. Patent No. Application 2,108,986, all of which are incorporated herein by reference.

The present invention provides a new screen printing composition containing a specific admixture of diazonium salts to the effect that a composition is formed having unexpectedly increased photosensitivity while maintaining acceptable solution stability and providing a means for lowering the overall amount of residual formaldehyde in the coating.

SUMMARY OF THE INVENTION

The invention provides a light sensitive screen printing composition which comprises in admixture A) at least one substantially water soluble binder resin component in sufficient amount to bind the composition components in a substantially uniform film when the composition is coated on a substrate and dried; and B) a photosensitive component in sufficient amount to substantially, uniformly photosensitize the composition, which photosensitive component consists essentially of both (a) and (b) in admixture, (a) from about 30% to about 70% based on the weight of the photosensitive component of the condensation product of a 4-diazo diphenyl amine of the formula (I):

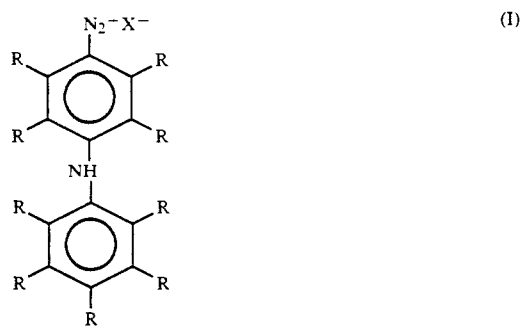

wherein each R is independently H, CH$_3$, CH$_2$CH$_3$, OCH$_3$ or OCH$_2$CH$_3$ and X is Cl$^-$, Br$^-$, I$^-$, BF$_4^-$, PF$_6^-$, SO$_4^{-2}$, HSO$_4^-$ or H$_2$PO$_4^-$; with formaldehyde, which condensation product is dissolved in a sufficient amount of a mineral acid having a water soluble anion, to form a solution; and (b) from about 30% to about 70% based on the weight of the photosensitive component of one or more compounds selected from the group consisting of (i) a substantially water soluble condensation product of a 4-diazo diphenyl amine of the formula (I) with a condensing agent having the formula $E(-CHR_a-OR_b)_m$ wherein E is a residue obtained by splitting off of m hydrogen atoms from a compound free of diazonium groups selected from the group consisting of aromatic amines, phenols, thiophenols, phenol ethers, aromatic thioethers, aromatic heterocyclic compounds, aromatic hydrocarbons and organic acid amides, $R_a$ is selected from the group consisting of hydrogen and phenyl, $R_b$ is selected from the group consisting of hydrogen, alkyl and acyl groups having 1 to 4 carbon atoms, and a phenyl group, and m is an integer from 1 to 10, which condensation product is precipitated with a water soluble organic sulfonic acid; and (ii) the condensation product of a 4-diazo diphenyl amine of the formula (I) with a condensing agent having the formula $$E(-CHR_a-OR_b)_m$$

wherein E is a residue obtained by splitting off of m hydrogen atoms from a compound free of diazonium groups selected from the group consisting of aromatic amines, phenols, thiophenols, phenol ethers, aromatic thioethers, aromatic heterocyclic compounds, aromatic hydrocarbons and organic acid amides, $R_a$ is selected from the group consisting of hydrogen and phenyl, $R_b$ is selected from the group consisting of hydrogen, alkyl and acyl groups having 1 to 4 carbon atoms, and a phenyl group, and m is an integer from 1 to 10, and which condensation product is dissolved in a sufficient amount of a mineral acid having a water soluble anion to form a solution; and C) sufficient water to form a substantially homogeneous admixture.

The invention also provides a screen printing article which comprises a mesh fabric coated with the aforesaid composition. The invention also provides a process for forming an image by coating and drying the aforesaid composition on a mesh fabric, imagewise exposing to actinic radiation and removing the nonimage areas with water alone.

DETAILED DESCRIPTION OF THE PREFERRED EMBODIMENT

As hereinbefore described, the invention provides a composition comprising A) a water soluble binder, B) a photosensitive component containing both photosensitizers (a) and (b), and water. Typically these components are blended into a substantially uniform admixture.

Suitable water soluble binders non-exclusively include polyvinyl alcohol, copolymers containing vinyl acetate, gelatin, hydroxyethyl cellulose, hydroxypropyl cellulose, carboxymethyl cellulose, polyvinyl pyrrolidone and polyethylene oxide. The most preferred polyvinyl alcohol is partially hydrolyzed polyvinyl alcohol, for example one having from about 80% to about 90% hydrolysis. In the preferred embodiment, the water soluble binder component is present in the overall composition in an amount of from about 5% to about 99% based on the weight of the non-solvent parts of the composition. A more preferred range is from about 7% to about 70% and most preferably from about 12% to about 32%. In the preferred embodiment the composition also includes a non-water soluble binder resin component such as polyvinyl acetate.

In the most preferred embodiment the binder comprises a mixture of from about 33% to about 90%, and preferably from about 40% to about 60% of hydrolyzed polyvinyl alcohol based on the weight of the binder resin component, plus from about 10% to about 67% and preferably from about 40% to about 60% of polyvinyl acetate based on the weight of the binder resin component.

The composition then contains a photosensitive component which is a mixture of diazonium condensates. Each diazonium component is per se known in the art and their production is described in U.S. Pat. No. 3,849,392 and U.K. Patent No. 1,312,926, each of which are incorporated by reference. While each of these individual diazonium condensates have individually been used in photosensitive compositions, it has been unexpectedly found that an admixture of the specified diazonium condensates produces an increased apparent photo speed on the order of about 40% to 50%. The photosensitive composition comprises both of the previously described compounds (a) and (b) wherein (b) is one or both of components (i) and (ii). While some diazonium compounds within the above formulas produce screen printing compositions with higher apparent light speed, such form compositions with disadvantageous solution stability. The instant composition maximizes apparent light speed while maintaining acceptable solution stability. The overall photosensitive component B is preferably present in the screen printing composition in an amount of from about 1.0% to about 10%, more preferably 1% to about 5% and most preferably from about 1% to about 2% based on the weight of the non-solvent parts of the screen printing composition.

Photosensitizer (a) is preferably present within the photosensitive component in an amount of from about 30% to about 70%, preferably from about 40% to about 60% and most preferably 50% based on the weight of the overall photosensitive component. Photosensitizer (b) is preferably present within the overall photosensitive component in an amount of from about 30% to about 70%, more preferably from about 40% to about 60% and most preferably about 50% based on the weight of the overall photosensitive component.

In the preparation of the diazonium salt condensates one begins with a 4-diazo diphenyl amine according to formula (I) above. Suitable diphenylamine-4-diazonium salts are, for example, the diazonium salts derived from the following amines:

4-diazo-diphenylamine
4-diazo-3-methoxy-diphenylamine
4-diazo-2-methoxy-diphenylamine
4'-diazo-2-methoxy-diphenylamine
4'-diazo-4-methoxy-diphenylamine
4-diazo-3-methyl-diphenylamine
4-diazo-3-ethyl-diphenylamine
4'-diazo-3-methyl-diphenylamine
4'-diazo-4-methyldiphenylamine
4-diazo-3-ethoxy-diphenylamine
4-diazo-3-hexyloxy-diphenylamine
4-diazo-3-hydroxy-ethoxy-diphenylamine
4'-diazo-2-methoxy-5-methyl-diphenylamine
4-diazo-3-methoxy-6-methyl-diphenylamine
4'-diazo-3,',-dimethyl-diphenylamine
3-chloro-4-diazo-diphenylamine
4'-diazo-4-n-butoxy-diphenylamine
4'-diazo-3',4-dimethoxy-diphenylamine
4-diazo-diphenylamine-2-sulfonic acid
4-diazo-diphenylamine-2-carboxylic acid
4-diazo-diphenylamine-2'-carboxylic acid, and 4'-bromo-4-diazo-diphenylamine.

Preferably employed are 4-diazo-diphenylamine and 3-methyl-4-diazo-diphenylamine, particularly preferable are the 3-alkoxy-4-diazo-diphenylamines having 1 to 3 carbon atoms in the alkoxy group, especially the 3-methoxy-4-diazodiphenylamine. Component (a) is prepared by condensing the diazo with formaldehyde by a method well known to the skilled artisan. In the usual case from about 2 to 10 diazo monomer units are joined across a phenyl ring by a methylene bridge. The salt is formed by reaction with a suitable reagent to impart the preferred anion to it.

Component (b)(i) is similarly condensed except the condensation is conducted with a condensing agent designated as $E(-CHR_a-OR_b)_m$ above.

With regard to such condensing agents, an important class are those derived from the substituted or unsubstituted aromatic hydrocarbons and aromatic heterocyclic compounds provided the basic compounds have nuclear positions capable of condensation, in an acid medium, with carbonyl compounds and accordingly, of receiving the $CHR_aOR_b$ groups.

These non-exclusively include:
Benzyl alcohol
Dibenzylether
1,3-Bis-hydroxymethyl-benzene
1,4-Bis-methoxymethyl-benzene
1,5-Bis-acetoxymethyl-naphthalene
1,4-Bis-hydroxymethyl-naphthalene
1-Hydroxymethyl-naphthalene
2-Hydroxymethyl-naphthalene
9,10-Bis-methoxymethyl-anthracene
9-Hydroxymethyl-phenanthrene
2,5-Bis-methoxymethyl-thiophene
2-Hydroxymethyl-furan
Bis-methoxymethyl-diphenyleneoxide
Bis-methoxymethyl-diphenylenesulfide
Bis-methoxymethyl-dimethyldiphenyleneoxide
2,6-Bis-hydroxymethyl-naphthalene
Benzhydrol
1,4-Bis-(alpha-hydroxybenzyl)-benzene
3-Methyl-hydroxymethyl-benzene
2,5-Dimethyl-hydroxymethyl-benzene
2-Methyl-5-isopropyl-hydroxymethyl-benzene
4,6-Dimethyl-1,3-bis-hydroxymethyl-benzene
2,5-Dimethyl-1,4-hydroxymethyl-benzene
2,4,6-Trimethyl-1,3-bis-hydroxymethyl-benzene
2,4,6-Trimethyl-1,3,5-tris-methoxymethyl-benzene
2,3,5,6-Tetramethyl-1,4-bis-acetoxymethyl-benzene
2,4,5,6-Tetramethyl-1,3-bis-ethoxymethyl-benzene
4-4'-Bis-acetoxymethyl-diphenylether
4,4'-Bis-methoxymethyl-diphenylether
2-Methyl-1,5-bis-acetoxymethyl-naphthalene
2-Ethyl-9,10-bis-methoxymethyl-anthracene
2,4-Diisopropyl-hydroxymethyl-benzene
4,6-Diisopropyl-1,3-bis-hydroxymethyl-benzene
4,6-Diisopropyl-1,3-bis-methoxymethyl-benzene
6-Chloro-1-hydroxymethyl-naphthalene
4,4'Bis-acetoxymethyl-diphenylsulfone
4,4'-Bis-methoxymethyl-benzophenone
4-Chloro-hydroxymethyl-benzene
1,4-Bis-hydroxymethyl-benzene The most preferred is 4,4'-bis(methoxymethyl)diphenyl ether. The condensation medium is a strong acid such as phosphoric, sulfuric, methane sulfonic, hydrochloric or hydrobromic acid. Preferred are mineral acids, most preferably phosphoric acid. The (b)(i) condensate is then precipitated with a water soluble sulfonic acid such as methane, ethane or propane sulfonate to impart a water soluble condensation product precipitate.

Component (b)(ii) is condensed in a manner like that of (b)(i) except it is not precipitated but is maintained in a solution of a strong acid.

Photosensitive components (a) and (b)(ii) each are composed of a condensate dissolved in a mineral acid in its respective solution. In (a), the condensate is preferably present in the acid solution in an amount of from about 40% to about 60% based on the weight of the solution components and the acid comprises the balance of the solution. In (b)(ii) the condensate is preferably present in the acid solution in an amount of from about 10% to about 40% based on the weight of the solution components and the acid comprises the balance of the solution. The acid may be any strong acid whose anion is a water soluble anion. Most preferably the acid is 70%–105% phosphoric acid. Other useful acids non-exclusively include sulfuric acid, hydrochloric acid, and hydrobromic acid in concentrations of about 40%–70%, the balance being water or other solvents as taught in U.S. Pat. No. 3,849,392 at column 9.

The composition then contains sufficient tap, demineralized or deionized water to formulate a substantially uniform admixture which is the screen printing composition. The composition may also contain minor amounts of other art recognized components such as biocides, buffering salts, fillers, humectants, anti-foam agents and solvents.

In another preferred embodiment, the composition contains a colorant which may be a pigment or dye. The colorant is preferably water soluble but must be at least water dispersible and is present in an amount to substantially, uniformly color the overall screen printing composition.

In preparing a screen printing screen using the composition of this invention, a fabric having the desired thread diameter, mesh count, and composition is first stretched to the desired tension, preferably by mechanical or pneumatic means, over a suitable frame. Fabrics that may be used include polyester, nylon and metals such as stainless steel and frames which may be used may be made of wood or metal, especially aluminum. Once stretched, the fabric is attached to the frame with adhesives (when wood or metal frames are used), staples (when wood frames are used) or by mechanical means (when self-stretching frames are used). The thusly prepared screen is then degreased to remove dirt, dust and any grease or oils that may interfere with the adherence of the coating composition to the mesh.

The screen is then coated with the composition of this invention by one of a variety of means well known to those skilled in the art. For instance, the composition may be applied directly to both sides of the screen using a scoop coater or doctor blade in multiple coats and then dried; the composition may also be coated on a transfer sheet, dried, and then applied to the screen as a film, either before or after exposure and development; or a combination of these methods may be used.

After the composition of this invention is dried, it is exposed to actinic radiation, preferably ultraviolet light through a suitable photomask. The areas which are exposed become cured, thereby hardening them and rendering them water insoluble. The areas which are not exposed remain water-soluble. Development is preferably with a water spray which removes the unexposed areas.

The screen is then dried, blocked-out and prepared for printing as is known to those skilled in the art. The inks used may be either water-based, solvent-based or plastisols.

The following examples are illustrative of the invention which is understood not to be limited thereto:

EXAMPLE 1

In a jacketed three-neck round bottom flask equipped with an overhead mechanical stirrer and a thermometer is prepared 95% phosphoric acid by mixing 270 g of 85% phosphoric acid and 270 g of 105% phosphoric acid. The contents are heated to 50° C. using a variable-temperature water circulating bath attached to the jacketed flask and thoroughly stirred until homogeneous. Upon cooling to 25° C.–30° C., 426 g (as 100%) of 4-diazonium diphenyl amine chloride is added and stirred for 1 hour to insure complete dissolution. The entire reaction is protected from light. To the stirring solution at 25° C.–30° C. are added 61 g of paraformaldehyde, and the temperature is raised to 40° C. where the mixture was aged isothermally for 24 hours. Upon cooling to 25° C., the condensate is vacuum-filtered, poured into brown corrosion-resistant plastic bottles, and stored in a refrigerator until needed. Net weight of product is 935 g (91% recovery).

EXAMPLE 2

In a jacketed three-neck round bottom flask equipped with an overhead mechanical stirrer, thermometer, and pressure-equalizing addition funnel, are mixed with stirring 280 g 85% phosphoric acid and 53 g (0.16 mol) 3-methoxy-4-diazonium diphenyl amine bisulfate. During dissolution the temperature is held constant at 30° C. using a variable-temperature water circulating bath attached to the jacketed flask. The entire reaction is protected from light. After 1 hour of stirring to insure total dissolution of the diazonium salt, 42.4 g (0.16 mol) 4,4′-bis(methoxymethyl)diphenyl ether (MMDPE) is added dropwise from an addition funnel to the stirring solution over a period of 40–45 minutes. When the MMDPE addition is complete, the temperature is raised to 40° C. and the mixture is aged isothermally for 17 hours. The final diazo product is precipitated as its methane sulfonate salt by drowning the aqueous diazonium salt solution into a 26% aqueous solution of methane sulfonic acid sodium salt. Vacuum filtration and proper drying affords 80 grams of a tan granular solid which is refrigerated until needed.

EXAMPLE 3

In a jacketed three-neck round bottom flask equipped with an overhead mechanical stirrer, thermometer, and pressure-equalizing addition funnel, are mixed with stirring 308.0 g 85% phosphoric acid and 58.3 g (0.18 mol) 3-methoxy-4-diazonium diphenyl amine bisulfate. During dissolution, the temperature is held constant at 30° C. using a variable-temperature water circulating bath attached to the jacketed flask. The entire reaction is protected from light. The time necessary for total dissolution ranges from 1–2 hours.

Upon total dissolution of the diazonium salt, 46.6 g (0.18 mol) 4,4′bis(methoxy methyl)diphenyl ether (MMDPE) is added dropwise from the addition funnel to the stirring solution over a period of 40–45 minutes, and the addition is accompanied by a 5° exotherm. When the MMDPE addition is complete, the internal temperature is raised to 40° C.±1° C. and the mixture is aged isothermally for 4 hours with stirring. After 4 hours, the viscous light-sensitive dark brown condensate is poured into brown corrosion-resistant plastic bottles and stored in a refrigerator until needed. Net weight of product is 400 g (97% recovery).

EXAMPLE 4

A stock emulsion is formed by the following components:

| | |
|---|---|
| Mowilith DM-1 (a copolymer of polyvinyl acetate and dibutyl maleate available from Hoechst AG | 23.91 |
| Drew Y250 (processing aid containing hyrophobic silica, processed oils and surfactants) | .01 |
| Polyvinyl alcohol (88% hydrolized, available as 22–88 from Hoechst AG) | 10.60 |
| potassium sorbate | 0.37 |
| ammonium acetate | 0.11 |
| demineralized water | 65.00 |
| | 100.00 |

Screen printing compositions are formed by first preparing a 35% emulsion which contains 35 parts by weight of the stock emulsion and 65 parts water. Five 1000 g batches of 35% emulsion are prepared and to each batch one of the following photosensitizers is added and evaluated. Each batch is adjusted to contain 6.8 g of active photosensitizer component. Where the photosensitive components are liquids, they are a mixture of photosensitizer, phosphoric acid and water such that 40% (i.e. 6.8 g) is active photosensitizer. 1:1 mixtures contain 3.4 g of each active photosensitizer. The mixtures are coated onto a 305 mesh polyester fabric stretched at 13–15 Newtons on a wood frame, and exposed in a Nu-arc exposure frame using a 1 Kw Mercury vapor light source, followed by tap water development, the following exposures are determined:

| Sensitizing System | Exposure (mj/cm$^2$) | Stouffer Guide (Solid/ Ghost) | Exposure | Stability | Overall Perform. |
|---|---|---|---|---|---|
| (a) | 70 | 2/7 | Slow | Good | Poor to Slow |
| (b)(i) | Did not dissolve | | | | Poor Unusable |
| (b)(ii) | 25 | 2/7 | Fast | Poor | Poor Unstable |
| 1:1 (a):(b)(ii) | 42 | 2/7 | Med–Fast | Good | Good |
| 1:1 (a):(b)(i) | 42 | 2/7 | Med–Fast | Good | Good |

These data show that emulsions prepared with component (a) as the only sensitizer has good stability but requires a long exposure to achieve acceptable stencil properties. The use of (b)(ii) liquid as the only sensitizer, shows an improvement in photospeed over (a), however the stability of the emulsion system is reduced. The (b)(i) solid diazo sensitizer cannot be readily dissolved, however mixing this solid, in equal proportions by weight, with the (a) oil produces a uniform sensitizer mixture which has good stability and medium to fast exposures. Mixtures of (a) with (b)(i) or (b)(ii) show an improvement in photospeed over the use of (a) as the only sensitizer while maintaining the good stability property of the emulsion produced with (a) alone.

What is claimed is:

1. A method for forming an image which comprises
I) providing a mesh fabric substrate, and
II) coating said substrate with a light sensitive screen printing composition which comprises in admixture
   A) at least one substantially water soluble binder resin component comprising an admixture of polyvinyl alcohol and polyvinyl acetate in an amount of from about 33% to about 90% polyvinyl alcohol and from about 10% to about 67% polyvinyl acetate based on the wight of the resin component, in sufficient amount to bind the composition components in a substantially uniform film when the composition is coated on a substrate and dried; and
   B) a photosensitive component in sufficient amount to substantially, uniformly photosensitize the composition, which photosensitive component consists essentially of both (a) and (b) in admixture,
      a) from about 30% to about 70% based on the weight of the photosensitive component of the condensation product of a 4-diazo diphenyl amine of the formula (I):

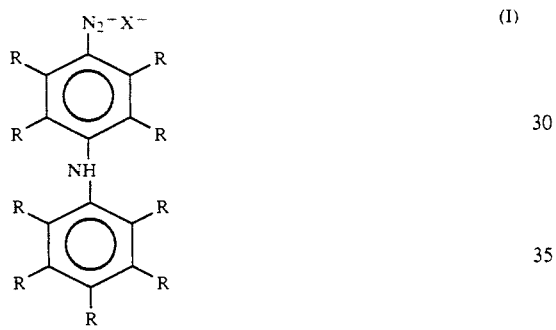

(I)

wherein each R is independently H, $CH_3$, $CH_2CH_3$, $OCH_3$ or $OCH_2CH_3$ and X is $Cl^-$, $Br^-$, $I^-$, $BF_4^-$, $PF_6^-$, $SO_4^{-2}$, $HSO_4^-$ or $H_2PO_4^-$; with formaldehyde, which condensation product is dissolved in a sufficient amount of a strong acid having a water soluble anion, to form a solution; and
      (b) from about 30% to about 70% based on the weight of the photosensitive component of one or more compounds selected from the group consisting of
         (i) a substantially water soluble condensation product of a 4-diazo diphenyl amine of the formula (I) with a condensing agent having the formula

$E(-CHR_a-OR_b)_m$ wherein E is a residue obtained by splitting off of m hydrogen atoms from a compound free of diazonium groups selected from the group consisting of aromatic amines, phenols, thiophenols, phenol ethers, aromatic thioethers, aromatic heterocyclic compounds, aromatic hydrocarbons and organic acid amides, $R_a$ is selected from the group consisting of hydrogen and phenyl, $R_b$ is selected from the group consisting of hydrogen, alkyl and acyl groups having 1 to 4 carbon atoms, and a phenyl group, and m is an integer from 1 to 10, which condensation product is precipitated with a water soluble organic sulfonic acid; and
         (ii) the condensation product of a 4-diazo diphenyl amine of the formula (I) with a condensing agent having the formula $E(-CHR_a-OR_b)_m$ wherein E is a residue obtained by splitting off of m hydrogen atoms from a compound free of diazonium groups selected from the group consisting of aromatic amines, phenols, thiophenols, phenolic ethers, aromatic thiophenols, phenolic ethers, aromatic thioethers, aromatic heterocyclic compounds, aromatic hydrocarbons and organic acid amides, $R_a$ is selected from the group consisting of hydrogen and phenyl, $R_b$ is selected from the group consisting of hydrogen, alkyl and acyl groups having 1 to 4 carbon atoms, and a phenyl group, and m is an integer from 1 to 10, and which condensation product is dissolved in a sufficient amount of a strong acid having a water soluble anion to form a solution wherein component A is present in an amount of from about 5% to about 99% based on the weight of the non-solvent parts of the composition; and wherein component B is present in an amount of from about 1% to about 10% based on the weight of the non-solvent parts of the composition; and wherein components (a) and (b) are each present in the photosensitive component in a amount of about 50% by weight of the photosensitive component; and wherein condensation products (i) and (ii) are formed from about an equimolar amount of the diazo and condensing agent reactants; and
   C) sufficient water to form a substantially homogeneous admixture; and
III) drying the composition; and
IV) imagewise exposing the composition to sufficient actinic radiation to provide a latent image on the coated substrate; and
V) removing the nonimage areas of the compositions by developing with water alone.

2. The method of claim 1 wherein said exposing is conducted with ultraviolet light.

3. The method of claim 1, wherein the composition further comprises a water dispersible colorant in sufficient amount to substantially uniformly color the composition.

4. The method of claim 1, wherein the binder resin component comprises one or more components selected from the group consisting of polyvinyl alcohol, polyvinyl acetate, gelatin, hydroxyethyl cellulose, hydroxypropyl cellulose, polyvinyl pyrrolidone, copolymers containing vinyl acetate, carboxymethyl cellulose and polyethylene oxide.

5. The method of claim 1, wherein the composition further comprises one or more components selected from the group consisting of anti-foam agents, biocides, buffering salts, solvents, fillers, and humectants.

6. The method of claim 1 wherein for component (a), subsitutent is hydrogen, X is chloride and the strong acid is phosphoric acid; and for component (b)(i) the R subsitutent in the 3 position is hydrogen or methoxy and each other R is hydrogen, X is $HSO_4^-$, and the condensing agent is 4,4'-bis-(methoxymethyl)diphenyl ether.

7. The method of claim 1 wherein for component (a) each R subsitutent is hydrogen, X is chloride and the strong acid is phosphoric acid; and for component (b)(i) the R subsitutent in the 3 position is hydrogen or methoxy, each other R is hydrogen; X is $HSO_4^-$; the strong acid is phosphoric acid and the condensing agent is 4,4'-bis-(methoxymethyl)diphenyl ether.

8. The method of claim 1 wherein the strong acid for component (a) and (b)(ii) is independently selected from the group consisting of phosphoric, sulfuric, methane sulfonic, hydrochloric and hydrobromic acid.

9. The method of claim 1 wherein the condensing agent for component (b) is 4,4,-bis-(methoxymethyl)-diphenyl ether.

* * * * *